United States Patent [19]

Harper

[11] 4,012,723
[45] Mar. 15, 1977

[54] MAGNETIC BUBBLE MEMORY PACKAGING ARRANGEMENT AND ITS METHOD OF FABRICATION

[75] Inventor: James G. Harper, Dallas, Tex.
[73] Assignee: Texas Instruments Incorporated, Dallas, Tex.
[22] Filed: May 29, 1975
[21] Appl. No.: 581,605
[52] U.S. Cl. .................. 340/174 TF; 29/604; 174/52 PE; 174/52 FP; 357/72; 340/324 M
[51] Int. Cl.² .................................. G11C 19/08
[58] Field of Search ............... 174/52 PE, 52 FP; 340/174 TF, 324 M; 357/65, 68, 70, 72; 317/101 A, 101 CP, 101 CC; 29/604

[56] References Cited
UNITED STATES PATENTS

| | | | |
|---|---|---|---|
| 3,668,688 | 6/1972 | Schmersal | 340/324 M |
| 3,784,725 | 1/1974 | Perkins et al. | 174/52 S |
| 3,836,896 | 9/1974 | Rifkin | 340/174 TF |

OTHER PUBLICATIONS

Michaelis et al., Magnetic Bubble Mass Memory—Module Design and Operation, IEEE Transactions on Magnetics, vol. MAG-9, No. 3, Sept. 1973, pp. 436-440, copyright 1973.
IBM Technical Disclosure Bulletin, vol. 13, No. 12, May, 1971, p. 3704.
IBM Technical Disclosure Bulletin, vol. 16, No. 7, Dec., 1973, pp. 2129-2130.

Primary Examiner—Stanley J. Witkowski
Attorney, Agent, or Firm—Harold Levine; Rene' E. Grossman; Stephen S. Sadacca

[57] ABSTRACT

Magnetic bubble chips are packaged along with X, Y and Z magnetic field generating means. The package is comprised of a metal lead frame upon which a magnetic bubble chip such as a memory chip device is mounted. Connectors are utilized to connect terminal pads on the bubble memory device to selected lead frame conductors. The lead frame includes selectively positioned terminal conductors which provide exterior terminals for X and Y magnetic field generating coils. The lead frame is plastic encapsulated with the plastic being formed to completely seal the magnetic bubble chip and connectors while providing mechanical support channels for X and Y magnetic field coils. Openings are provided in the plastic within the channels parallel to the plane of the lead frame on opposite sides thereof exposing the selectively positioned conductors so that the coils are electrically connected to the lead frame terminal conductors. Permanent magnets are provided on either end of the structure and magnetic field spreading plates are provided over the top and bottom of the structure parallel to the plane of the lead frame to generate a constant Z magnetic field.

24 Claims, 9 Drawing Figures

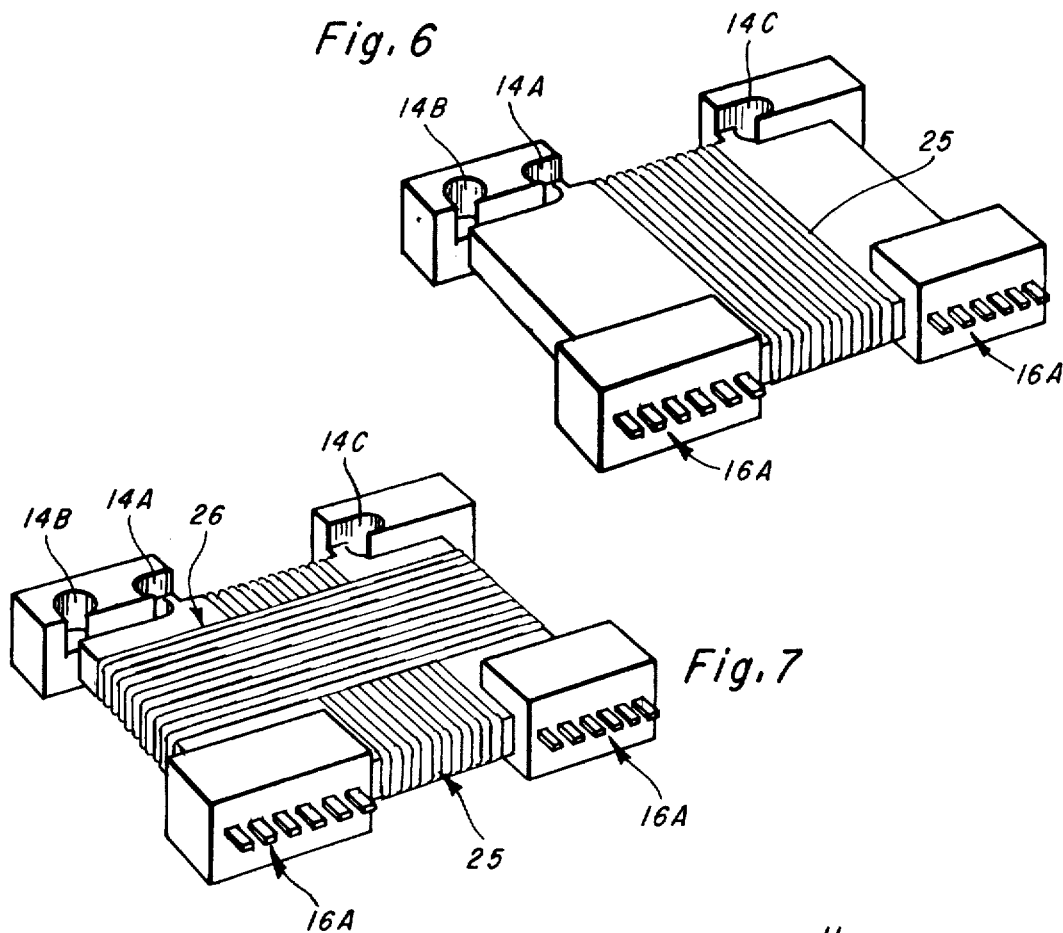
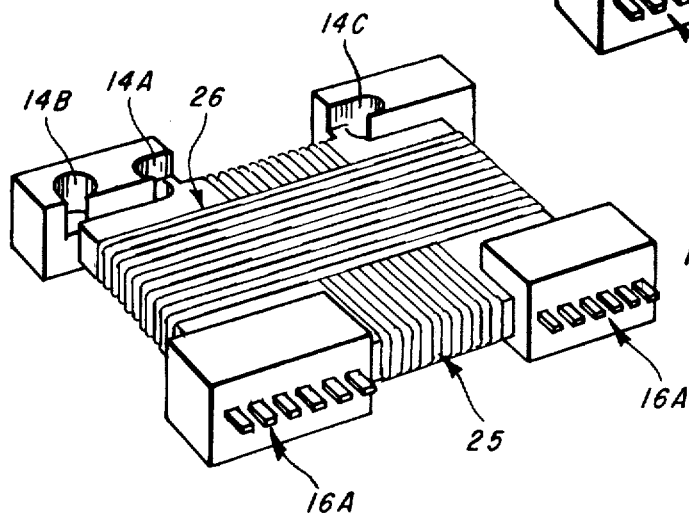
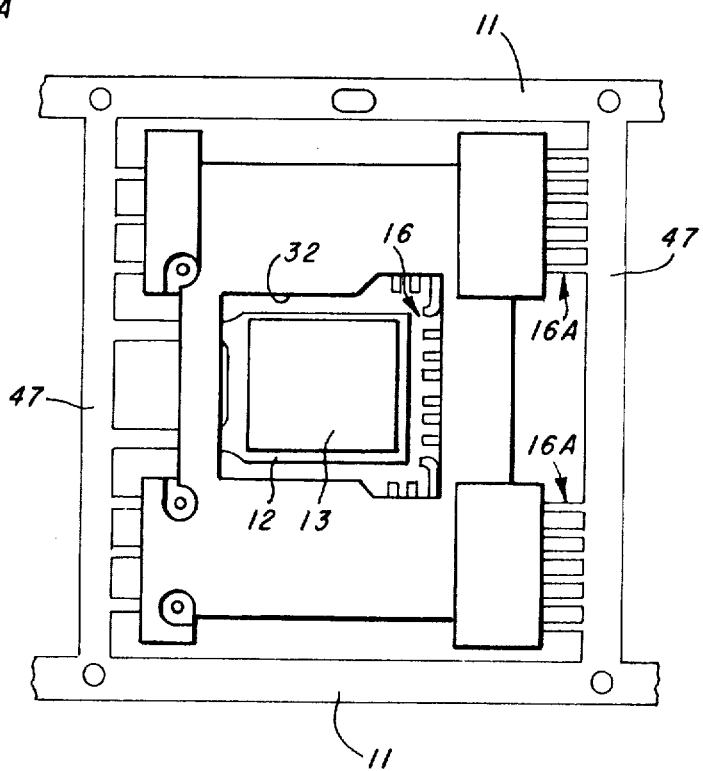

MAGNETIC BUBBLE MEMORY PACKAGING ARRANGEMENT AND ITS METHOD OF FABRICATION

This invention relates to magnetic bubble devices and, more particularly, to uniquely packaged magnetic bubble devices with self-contained X, Y and Z magnetic field generating means and their method of fabrication.

Magnetic bubble memory devices have been of growing interest because of the ability to store more bits of information in less space than now required by conventional methods such as ferrite cores and to produce the stored information in a less complicated manner than is presently possible. Magnetic bubble memories have been developed in which very large numbers of bit information can be stored in very small areas. Further, techniques are being developed by which bits stored in magnetic bubble chips can be processed on the same or other magnetic bubble chips with various logic and switching functions being performed with less power being required than with conventional computer circuitry and with greater reliability.

Some drawbacks to implementing magnetic bubble chips and devices into system designs are the need to package the chips cheaply and reliably. Unlike conventional electronic circuits, magnetic bubble devices require a specific magnetic environment in order to operate properly. Three magnetic fields are required to create this environment. The first or Z field is a constant magnetic field perpendicular to the surface of a magnetic bubble chip and is used to maintain magnetic bubble domains in the chip in the proper physical diameters. The second and third or X and Y fields are excited in such a manner as to produce a rotating magnetic field parallel to the plane of the surface of the chip. As this field rotates, it interacts with magnetizable elements on the surface of the chip, thus creating time-varying magnetic field gradings, which control the movement of the magnetic bubble domains in the chip. Thus, any design utilizing magnetic bubble devices necessarily has to provide the proper magnetic environment for each chip. Many arrangements have been suggested in which a large number of magnetic bubble chips are mounted on a single substrate and share a common set of magnetic field generating coils. The problem with this arrangement is that it is difficult to replace the chips in the event that any of them malfunction.

It is therefore an object of the present invention to provide an improved packaging technique for magnetic bubble chips.

It is another object of the invention to provide a simplified method of manufacturing packaged magnetic bubble chips with individually self-contained magnetic field generators.

Still another object of the invention is to provide a simple and inexpensive packaging technique for magnetic chips.

A further object of the invention is to provide packaged magnetic bubble devices which are easily and individually connectable or disconnectable in a system employing a large number of such devices.

These and other objects are accomplished in accordance with the present invention by providing a non-magnetic electrically conductive lead frame upon which a magnetic bubble chip is mounted. The lead frame includes conductors to which terminals on the magnetic bubble chip are electrically connected. The lead frame further includes selectively positioned conductors which provide external terminals to magnetic field producing coils. The lead frame is plastic encapsulated with the plastic being formed to completely seal the integrated circuit and connectors while providing in the same step a pair of mechanical support channels for X and Y magnetic field coils. These two channels extend perpendicularly around the package. The first or X coil is would around the package within its channel about an axis essentially parallel to the plane of the magnetic bubble chip for producing a magnetic field parallel thereto. The second or Y coil surrounds the first coil and is wound within its channel about an axis perpendicular to that of the first coil and essentially parallel to that of the plane of the magnetic bubble chip for producing a magnetic field parallel to the plane of the chip and perpendicular to the field produced by the first coil. The first and second coils are excited in such a manner that they produce a rotating magnetic field parallel to the plane of the magnetic bubble chip to control the movement of magnetic bubbles therein. Permanent magnets are provided at opposite ends of the package and a pair of magnetic field spreading plates is provided with each extending over corresponding ends of both of the permanent magnets in a plane parallel to the magnetic bubble chip. The permanent magnets thus provide a constant magnetic field in the Z direction perpendicular to the plane of the magnetic bubble chip. Magnetic bubble chips packaged according to the invention are self-contained and are easily connected or disconnected from a circuit assembly or system such as a magnetic bubble memory system.

Further objects and advantages of the invention ill become apparent from the detailed description and claims and from the accompanying drawings wherein:

FIG. 6 is a perspective view showing the X magnetic field coil in place;

FIG. 7 is a perspective view showing the Y magnetic field coil in place;

FIG. 9 is a top planar view showing an intermediate stage in the fabrication utilizing an alternate method.

Figure 1:
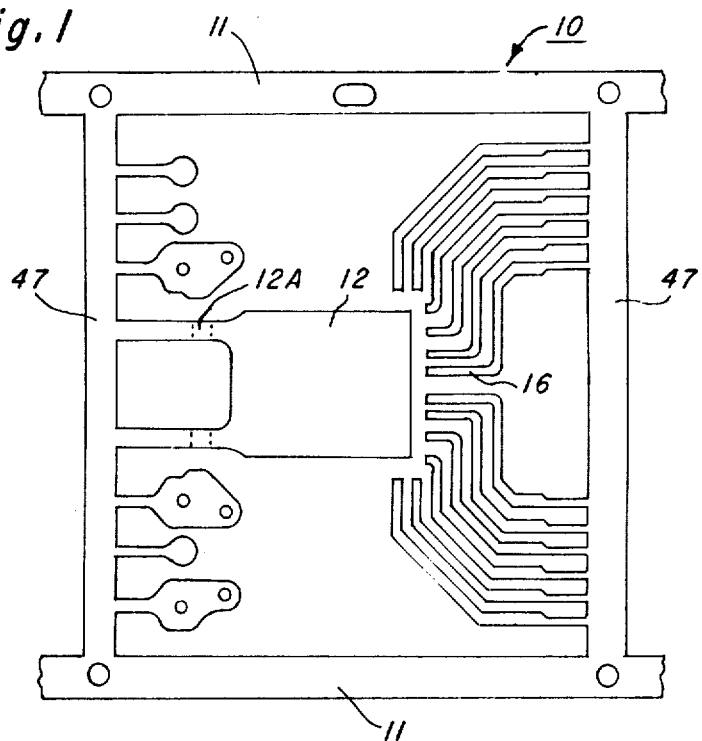
FIG. 1 is a top planar view of the upper major surface of a lead frame utilized in accordance with an embodiment of the present invention.

Referring then to the drawings, a packaged magnetic bubble chip embodied in the present invention is manufactured by providing a single metal lead frame 10 as shown in FIG. 1. The lead frame 10 is, for example, stamped out of a strip of 0.010 inch thick copper or other metal having nonmagnetic properties. A number of the lead frames 10 are conveniently stamped out of a single strip with a portion 11 of the strip utilized as a carrier to facilitate handling in process. Other portions 47 of the strip are also left in place to support some of the lead frame conductors through processing.

Figure 2:
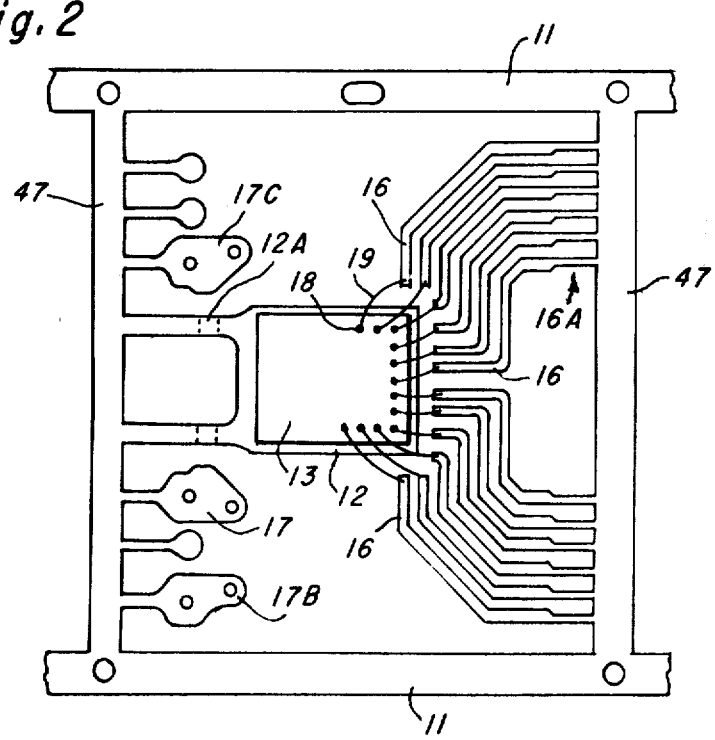
FIG. 2 is a top planar view showing a magnetic bubble chip mounted on a pad of the lead frame of FIG. 1.

A mounting pad 12 is provided by the lead frame 10 upon which a magnetic bubble chip such as a magnetic bubble memory chip 13 is mounted by means of an adhesive such as epoxy. The pad 12 may be bent around a line 12A to a lower elevation than the remainder of the lead frame. Connectors such as wires 19 selectively connect the terminal pads 18 on the magnetic bubble chip to selected lead frame conductors 16 as shown in FIG. 2. The wires are bonded by either thermocompression or ultrasonic bonding techniques. Lead frame 10 also includes selectively positioned conductors 17A-C which provide external terminals to magnetic field producing coils.

Figure 3:
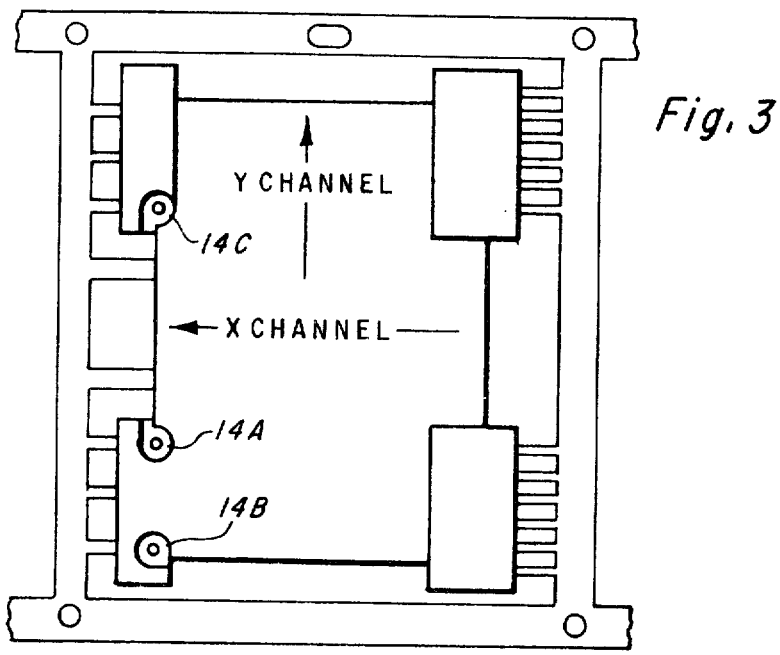
FIG. 3 is a top planar view of the plastic encapsulated lead frame.

Next, as illustrated in FIG. 3, the lead frame is plastic encapsulated with the plastic being formed to completely seal the magnetic bubble chip 13, conductors 16 and connectors 19 while providing in the same step a pair of mechanical support channels for X and Y magnetic field coils.

The plastic encapsulation is preferably by transfer injection molding techniques utilizing, for example, epoxy novolak, a well known material used in the injection molding of electronic circuits and the like. For example, the transfer injection molding takes place with the molds maintained at about 180° C under about 50-125 ton pressure with the novolak injected at about 200 psi. The carrier strip 11 and the portions 47 which support the conductors 16 and 17A-C until the injection molding process is complete are then removed resulting in the structure of FIG. 4.

Figure 4:
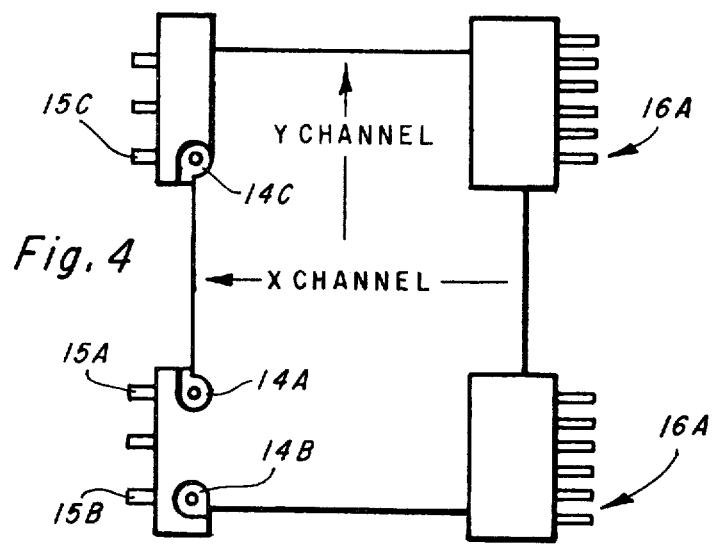
FIG. 4 is a top planar view of the encapsulated lead frame with the carrier portion removed.

As shown in FIGS. 3 and 4, the mold is formed to provide in the injected plastic the X and Y channels which extend perpendicularly to each other around the package and openings 14A-C exposing the selectively positioned conductors 17A-C, respectively, of the lead frame. The openings 14A-C are provided in both upper and lower major surfaces of the package so that the conductor ends of the coils may be inserted from one major surface and ohmically connected to the conductors 17A-C by soldering techniques, for example, from the opposite major surface.

Figure 5:
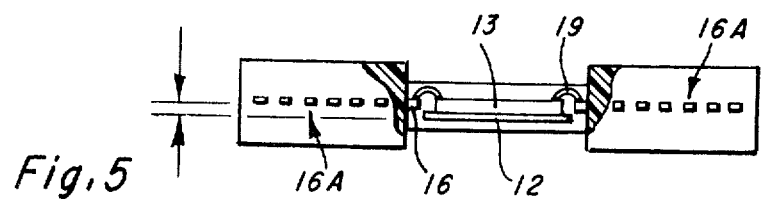
FIG. 5 is a sectioned view of the plastic encapsulated lead frame of FIG. 3.

FIG. 5 shows the encapsulated magnetic bubble chip 13 in cross-section. It should be noted, as discussed above, the lead frame pad 12 upon which the magnetic bubble chip 13 is mounted is preferably positioned in a plane displaced from the plane of the remainder of the lead frame conductors so that the upper major surface of the magnetic bubble chip 13 is in approximately the same plane as the surface of conductors 16. This facilitates the connection of wires between the conductors 16 and the input/output terminal pads 18 of the chips 13.

Referring now to FIG. 6, the X coil 25 is next wound about the encapsulated magnetic bubble chip within the X channel provided therefor. The ends of the coil are ohmically connected to the selectively positioned terminal conductors 17A and C by means of the openings 14A and C, respectively. Next, as shown in FIG. 7, the Y magnetic field producing coil 26 is wrapped about the encapsulated magnetic bubble chip over the coil 25 within the Y channel provided therefor. The ends of the coil 26 are ohmically connected to the selectively positioned terminal conductors 17A and B, respectively.

Figure 8:
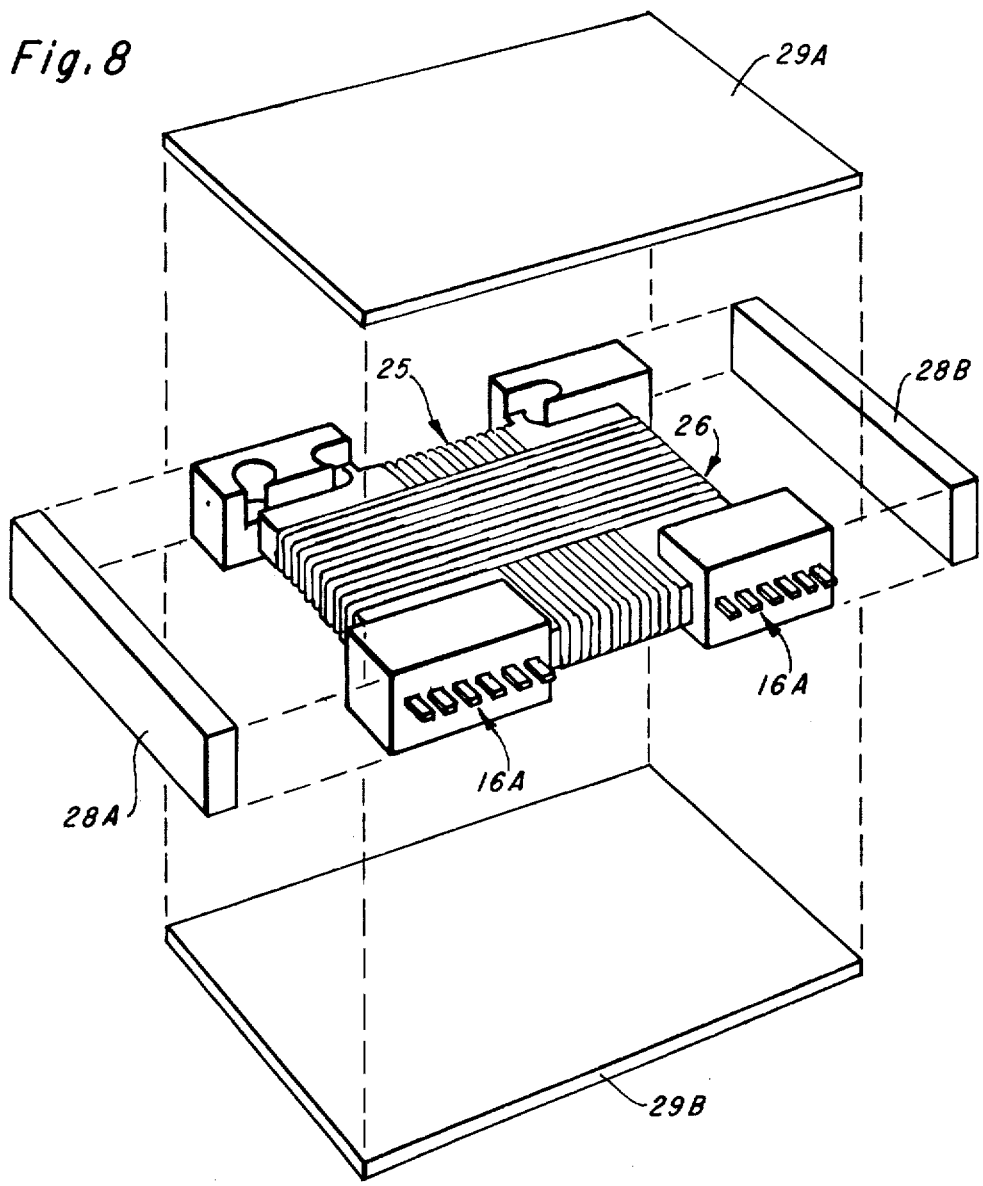
FIG. 8 is an exploded perspective view of the package showing the positioning of a pair of permanent magnets providing the Z magnetic field.

The Z magnetic field is provided by permanent bar magnets 28A and B which are positioned at opposite ends of the assembly as shown in FIG. 8. Magnetic spreading plates 29A and B are then positioned over the top and bottom major surfaces of the structure parallel to the plane of the magnetic bubble chip to provide a uniform constant Z magnetic field from magnets 25A and B. The X and Y magnetic coils may be connected to external electrical excitation signals by means of terminals 15A-C shown in FIG. 4. The input and output signals to the magnetic bubble chip are provided on external terminals 16A.

In an alternate embodiment, as shown in FIG. 9, the lead frame of FIG. 1 is plastic encapsulated before the magnetic bubble chip 13 is mounted on the mounting pad 12 provided therefore leaving an opening 32 in the plastic above the mounting pad. After the lead frame has been encapsulated, the magnetic bubble chip 13 is mounted on the pad 12 through the opening 32 utilizing, for example, an epoxy adhesive. The opening 32 is also utilized in connecting the terminal pads on the magnetic memory device 13 to selected of the lead frame conductors 16 by connector wires or the like. The opening 32 is then filled with a plastic material such as a plastic epoxy material and the support portions 11 and 47 of the lead frame removed resulting in a structure similar to that of FIG. 4. The remaining steps in the process are then the same as those described with respect to FIGS. 5-8 above.

Since it is obvious that many additional changes and modifications can be made to the above described details without departing from the nature and spirit of the invention, it is understood that the invention is not to be limited to said details except as set forth in the appended claims.

What is claimed is:

1. A package assembly for a magnetic bubble domain chip, said package assembly comprising:
   a. a metal lead frame having a plurality of selectively positioned electrical conductors and a chip receiving region adjacent to corresponding ends of said plurality of electrical conductors;
   b. a magnetic bubble domain chip mounted on said chip receiving region of said metal lead frame and having a plurality of magnetic bubble domain functions associated therewith;
   c. a plurality of electrical contacts on said ship for said magnetic bubble domain functions to enable selective actuation thereof;
   d. means electrically interconnecting at least some of said electrical contacts on said chip with respective electrical conductors of said lead frame;
   e. a body of insulating material encapsulating said chip and said lead frame, the other ends of said electrical conductors extending outwardly of said insulating body and terminating in connector pins;
   f. means for providing a selectively energizable in-plane magnetic field for said chip including first and second field coil means respectively encircling said insulating body and arranged in orthogonal relation to each other;
   g. permanent magnet means mounted on opposite ends of said insulating body in spaced relation to said first and second field coil means; and
   h. magnetic field spreader members of magnetic material mounted on opposite major surfaces of said insulating body in spaced relation to said first and second field coil means, said magnetic field spreader members respectively engaging said permanent magnet means and defining therewith a magnetic enclosure for said encapsulated magnetic bubble domain chip; wherein i. said body of insulating material has enlarged spacer portions extending beyond the dimensions of said first and second field coil means with said permanent magnet means and said magnetic field spreader members abutting said enlarged spacer portions of said insulating body in respective spaced relation to said first and second field coil means.

2. The package assembly for a magnetic bubble domain chip as set forth in claim 1 wherein said lead frame is comprised of a non-magnetic material.

3. The package assembly for a magnetic bubble domain chip as set forth in claim 2 wherein said lead frame is comprised of copper.

4. The package assembly for a magnetic bubble domain chip as set forth in claim 2 wherein said lead frame is on the order of 0.01 inch in thickness.

5. The package assembly for a magnetic bubble domain chip as set forth in claim 1 wherein said insulating material is a molded plastic material.

6. An electronic package assembly for a magnetic bubble domain chip as set forth in claim 1 including electrically conductive terminal members in said insulating body having respective exterior portions extending outwardly of said insulating body, said body having openings exposing the surface of interior portions of said terminal members with said first and second field coil means being ohmically connected to the exposed interior portions of selected ones of said terminal members.

7. A package assembly for a magnetic bubble domain chip, said package assembly comprising:
 a. a metal lead frame having a first plurality of selectively positioned electrical conductors, a chip receiving region adjacent to corresponding ends of said first plurality of electrical conductors and a second plurality of electrical conductors;
 b. a magnetic bubble domain chip mounted on said chip receiving region of said lead frame and having a plurality of magnetic bubble domain functions associated therewith;
 c. a plurality of electrical contacts on said chip for inputting and/or outputting signals associated with said magnetic bubble domain functions;
 d. means electrically interconnecting at least some of said electrical contacts on said chip with respective ones of said first plurality of electrical conductors of said lead frame;
 e. a body of insulating material encapsulating said chip and said lead frame with ends of each of said conductors of said first and second pluralities of conductors extending outwardly of said insulating body and terminating in connector pins, said body having first and second channels extending orthogonally to each other around the exterior of said body with portions of each of said second plurality of lead conductors being exposed through respective openings in said body internally or externally near the periphery of said channels; and
 f. means for providing an in-plane selectively energizable magnetic field for said chip including first and second field coil means encircling said insulating body in said first and second channels, respectively, each of said coil means being ohmically connected to selected of said second plurality of electrical conductors through said openings.

8. The package assembly for a magnetic bubble domain chip according to claim 7 including permanent magnet means mounted on opposite ends of said insulating body in spaced relation to said first coil means with said first coil means being recessed in its respective channel and magnetic field spreader members of magnetic material mounted on opposite major surfaces of said insulating body in spaced relation to said first and second field coil means with said first and second coil means being recessed in their respective channels, said magnetic field spreader members respectively engaging said permanent magnet means and defining therewith a magnetic enclosure for said encapsulated magnetic bubble domain chip.

9. The package assembly for a magnetic bubble domain chip as set forth in claim 7 wherein said lead frame is comprised of a non-magnetic material.

10. The package assembly for a magnetic bubble domain chip as set forth in claim 9 wherein said lead frame is comprised of copper.

11. The package assembly for a magnetic bubble domain chip as set forth in claim 9 wherein said lead frame is on the order of 0.01 inch in thickness.

12. The package assembly for a magnetic bubble domain chip as set forth in claim 7 wherein said insulating material is a molded plastic material.

13. A packaging circuit arrangement comprising:
 a. a circuit device having a plurality of terminal pads;
 b. an external circuit component;
 c. a metal lead frame having a plurality of lead conductors including at least one of said lead conductors providing an electrical connection terminal to said external circuit component;
 d. means selectively ohmically connecting the terminal pads of said circuit device to said lead conductors; and
 e. encapsulating means completely encapsulating said circuit device, said encapsulating means having:
  i. first and second opposite surfaces;
  ii. a cavity therein selectively positioned with respect to said at least one lead conductor extending to said first surface with a portion of said at least one lead conductor exposed through a first opening located externally near the periphery of said cavity, first opening extending to said first surface and said external circuit component being supported within said cavity and ohmically connected to said portion of said at least one lead conductor, and
  iii. a second opening opposite first opening and extending to said second surface, said second opening exposing said portion of said at least one lead conductor to facilitate the ohmic connection of said external device to said at least one lead conductor.

14. The circuit arrangement according to claim 13 wherein said encapsulating means is comprised of injection molded plastic.

15. The circuit arrangement according to claim 13 wherein the thickness of said lead frame is on the order of 0.010 inch.

16. The circuit arrangement according to claim 13 wherein said lead frame includes a mounting pad upon which said circuit device is mounted.

17. The circuit arrangement according to claim 16 wherein said means selectively connecting the terminal pads of said circuit device to said lead conductors are comprised of bonded wires.

18. A circuit arrangement comprising:
   a. a circuit device having a plurality of terminal pads;
   b. an external circuit component;
   c. a metal lead frame having a plurality of lead conductors including at least one of said lead conductors providing an external electrical connection terminal to said external circuit component;
   d. means selectively ohmically connecting the terminal pads of said circuit device to said lead conductors; and
   e. encapsulating means completely encapsulating said circuit device, said encapsulating means having:
      i. a channel extending around the exterior thereof selectively positioned with respect to said at least one lead conductor;
      ii. a first opening internally or externally near the periphery of said channel, with a surface of a portion of said at least one lead conductor exposed through said first opening, said external circuit component being supported by said encapsulating means within said channel and ohmically connected to said at least one lead conductor through said first opening;
      iii. a second opening opposite said first opening exposing an opposite surface of said portion of said at least one lead conductor to facilitate the ohmic connection of said external device to said at least one lead conductor.

19. The circuit arrangement according to claim 18 wherein said circuit device is a magnetic bubble domain device.

20. The circuit arrangement according to claim 18 wherein said external circuit component is a magnetic field generating coil.

21. The circuit arrangement according to claim 18 wherein said lead frame is comprised of copper.

22. A method of packaging a circuit device comprising:
   a. mounting said circuit device on a mounting pad of a metal lead frame, said lead frame including at least one lead conductor providing an external electrical connection terminal to a coil;
   b. bonding wire connectors between terminal pads on said circuit device and selected ones of said lead frame conductors;
   c. placing the lead frame in a mold having a mold cavity;
   d. injecting a plastic material into the cavity of said mold to form a body completely encapsulating said circuit device, the mold being formed to provide in the injected plastic a channel extending through four surfaces around said body for the mechanical support of said cavity and openings exposing opposite surface of said at least one lead conductor;
   e. removing the encapsulated lead frame from said mold;
   f. wrapping a wire around said body within said cavity to form said coil; and
   g. ohmically bonding said external circuit component to said at least one lead conductor through said openings.

23. The method according to claim 22 wherein said plastic material is an epoxy material.

24. The method according to claim 22 wherein said circuit device is a magnetic bubble domain device.

* * * * *